(12) United States Patent
Tatsumi

(10) Patent No.: US 6,573,211 B2
(45) Date of Patent: Jun. 3, 2003

(54) METAL OXIDE DIELECTRIC FILM

(75) Inventor: Toru Tatsumi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/940,473

(22) Filed: Aug. 29, 2001

(65) Prior Publication Data

US 2002/0025453 A1 Feb. 28, 2002

(30) Foreign Application Priority Data

Aug. 30, 2000 (JP) ......................... 2000-260823

(51) Int. Cl.$^7$ ................. C04B 35/46; C04B 35/48; C04B 35/49
(52) U.S. Cl. ................. 501/134; 428/699; 428/701; 428/702
(58) Field of Search ............... 428/688, 689, 428/697, 701, 702; 252/62.9; 501/134

(56) References Cited

U.S. PATENT DOCUMENTS 6,340,621 B1 * 1/2002 Anderson et al.

FOREIGN PATENT DOCUMENTS

JP    11-317500    11/1999

OTHER PUBLICATIONS

H. Funakubo et al., "Film Thickness Dependence of Dielectric Property and Crystal Structure of PbTiO$_3$ Film Prepared on Pt/SiO$_2$/Si Substrate by Metal Organic Chemical Vapor Deposition", Jpn. J. Appl. Phys. vol. 32, No. 9B, Sep. 1993, pp. 4175–4178 with Abstract.

N. Tanabe et al., "A Ferroelectric Capacitor over Bit–line (F–COB) Cell for High Density Nonvolatile Ferroelectric Memories", 1995 Symposium on VLSI Technology Digest of Technical Papers, pp. 123–124 with Abstract. No month.

S. Onishi et al., "A Half–Micron Ferroelectric Memory Cell Technology with Stacked Capacitor Structure", International Electron Devices Meeting Technical Digest, (1994), pp. 843–846 with Abstract. No month.

P–Y. Lesaicherre et al., "A Gbit–scale DRAM stacked capacitor technology with ECR MOCVD SrTiO$_3$ and RIE patterned RuO$_2$/TiN storage nodes", International Electron Device Meeting Technical Digest, (1994), pp. 831–834 with Abstract. No month.

* cited by examiner

Primary Examiner—Deborah Jones
Assistant Examiner—Arden B. Sperty
(74) Attorney, Agent, or Firm—Sughrue Mion, PLLC

(57) ABSTRACT

A metal oxide dielectric film of perovskite type represented by ABO$_3$, wherein a composition ratio between an A-element and a B-element contained in the film satisfies the following Equation (1-1), and an amount of an oxide of the A-element contained in the film satisfies the following Equation (1-2):

$$1 < [A]/[B] \leq 1.1 \quad (1\text{-}1)$$

where $[A]/[B]$ represents a composition ratio between the A-element and the B-element, $$(I_{AO}/I_{ABO3}) < 10^{-2} \quad (1\text{-}2)$$

where $I_{AO}$ and $I_{ABO3}$ respectively represent (111) peak intensity of an oxide of the A-element and (100) peak intensity of the metal oxide dielectric in an X-axis diffraction spectrum.

18 Claims, 14 Drawing Sheets

FIG.5
Zr/Ti=0.5
Pb EXCESS 1%
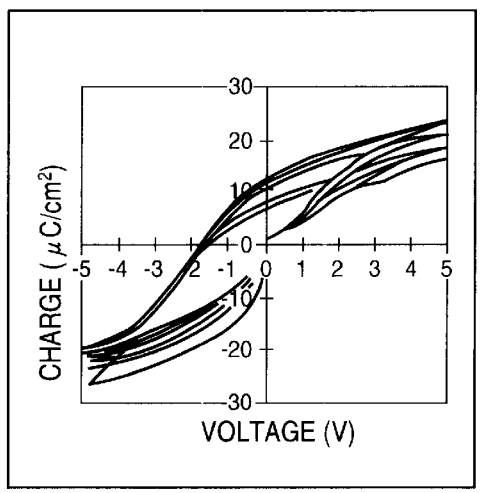
Pb EXCESS 6%
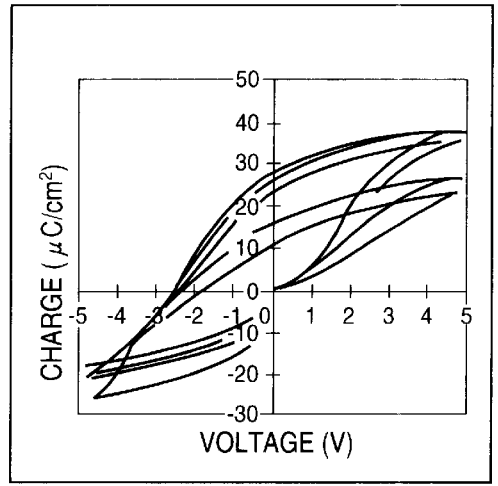
Pb EXCESS 4%
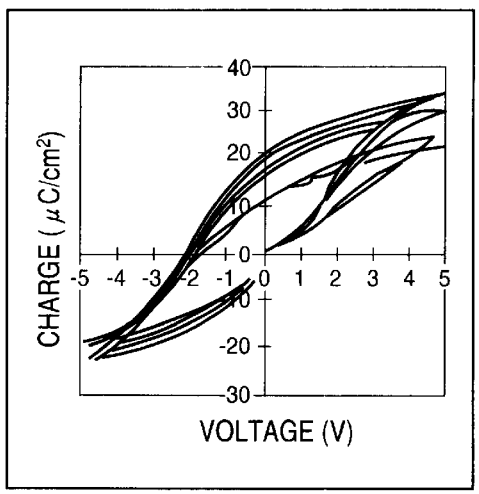
Pb EXCESS 13%
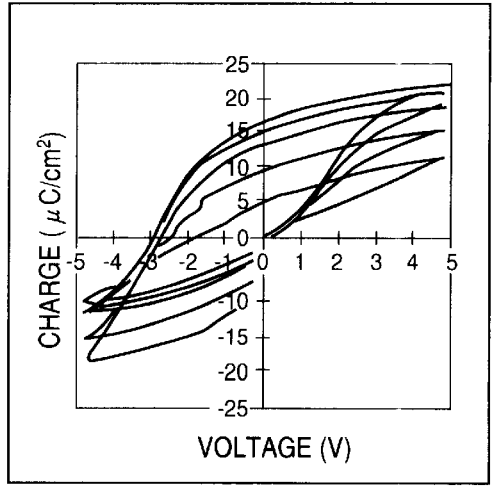

FIG.6
Zr/Ti=0.75
Pb EXCESS 4%
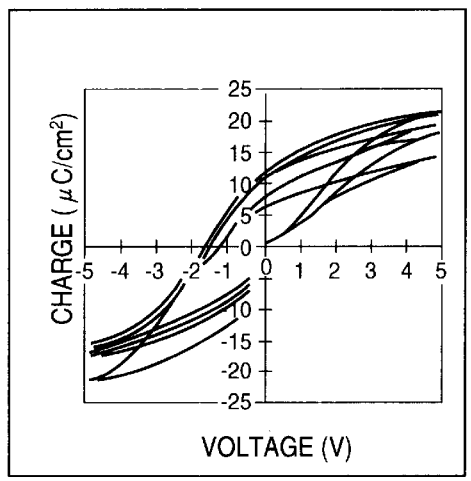
Pb EXCESS 7%
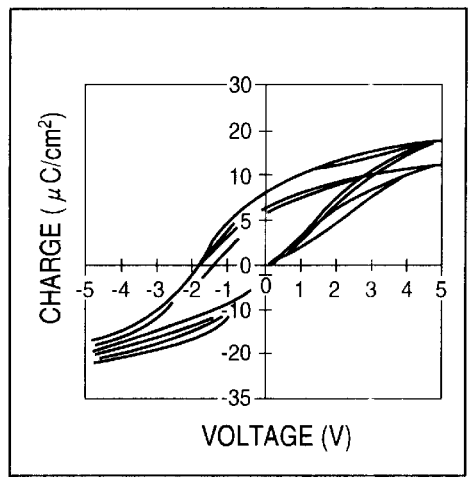
Pb EXCESS 5%
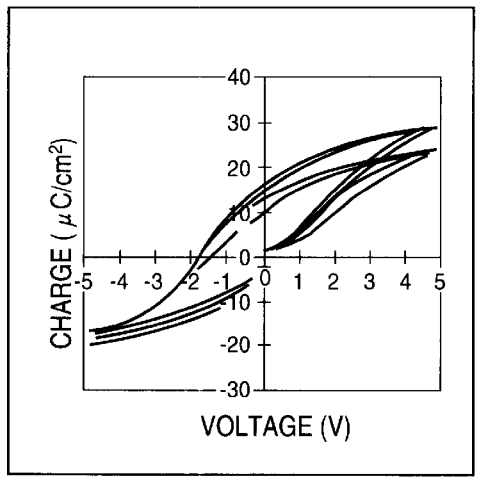
Pb EXCESS 17%
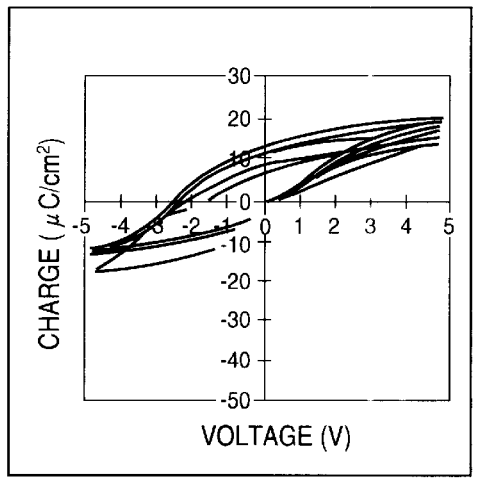

FIG.7
Zr/Ti=0.9
Pb EXCESS 4%
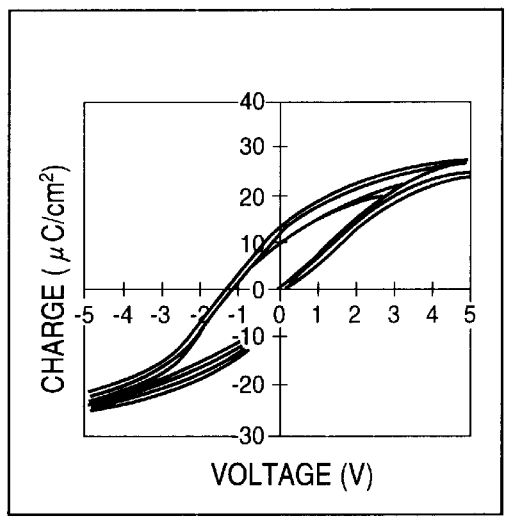
Pb EXCESS 6%
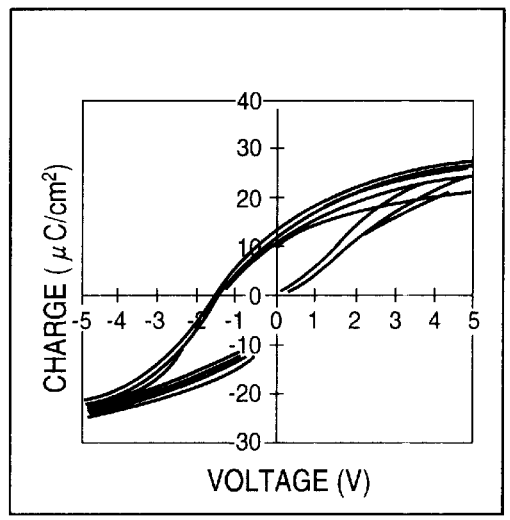
Pb EXCESS 5%
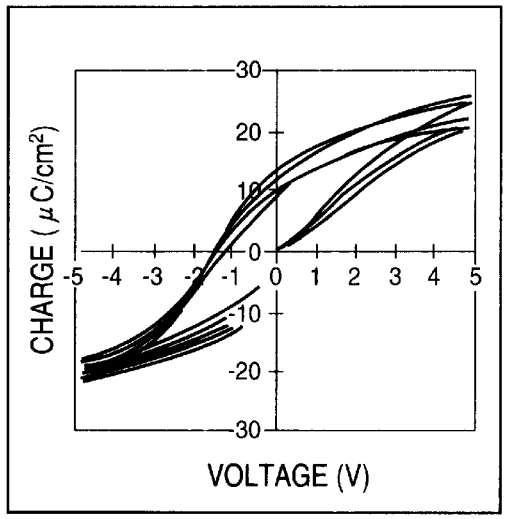
Pb EXCESS 18%
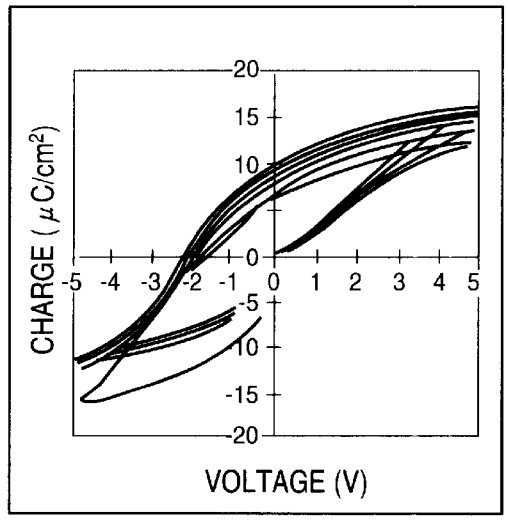

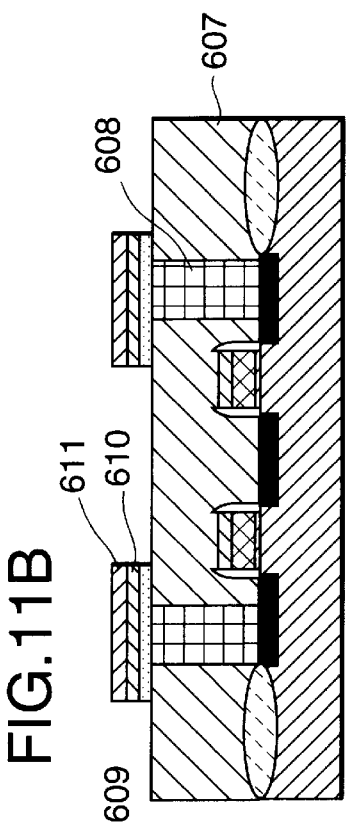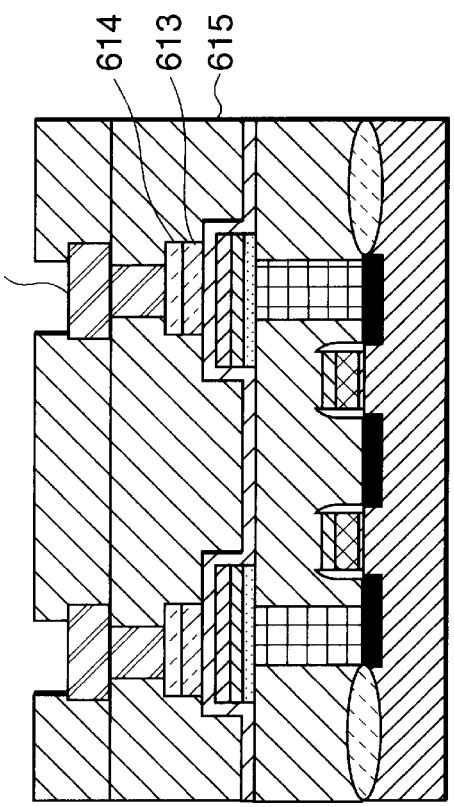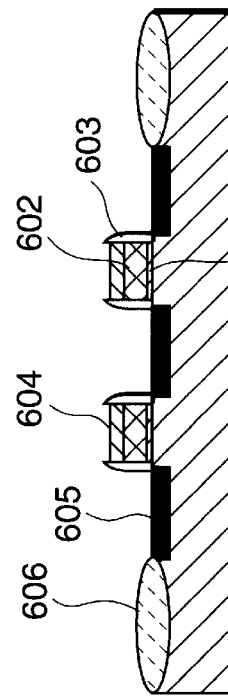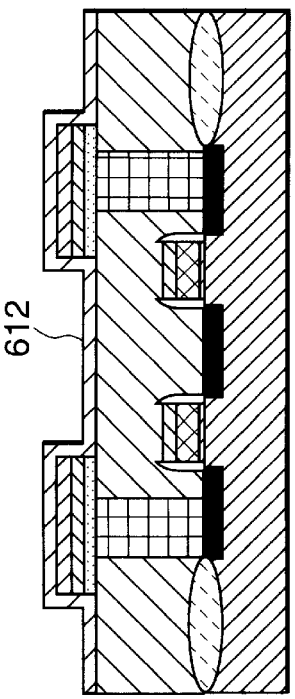

METAL OXIDE DIELECTRIC FILM

BACKGROUND OF THE INVENTION

1. Field of the Invention

The present invention relates to a semiconductor device having capacitor elements. In particular, the present invention relates to a high-dielectric-constant film and a ferroelectric film which is made by using an organometal material gas, and is used for a capacitor or a gate of a semiconductor integrated circuit.

2. Description of the Related Art

In recent years, nonvolatile ferroelectric memories, which utilizes a ferroelectric capacitor, and dynamic random access memories (DRAMs), which utilizes a high-dielectric capacitor, have been actively investigated and developed. These ferroelectric memories and DRAMs comprise selective transistors and data-storing capacitors, and in a memory cell a capacitor connected to one diffusion layer of the selective transistor. A ferroelectric capacitor uses a ferroelectric film made of $Pb(Zr,Ti)O_3$ (hereinafter, referred to as "PZT") etc., as a capacitor insulating film, and thereby storing non-volatile information by polarizing a ferroelectric.

On the other hand, a high-dielectric capacitor uses a high-dielectric thin film made of $(Ba,Sr)TiO_3$ (hereinafter, referred to as "BST") etc., as a capacitor insulating film. Therefore, the capacitance of the capacitor can be increased to miniaturize a device. When such a ceramic material is used for a semiconductor device, it is very important to electrically isolate such a ceramic material of each memory cell as a minute capacitor. A ceramic material film is deposited on a crystallize-assisting conductive film that is to be a lower electrode.

As a method for depositing ceramic thin film, a conventional sol-gel process, sputtering, and chemical vapor deposition (CVD) have been reported.

The sol-gel process is a method in which organometallic materials dissolved in an organic solvent are applied to a wafer having a lower electrode formed thereon by a spin-coating, and crystallized by annealing in the presence of oxygen. This process causes crystallization in a solid phase, so that a very high temperature is required for crystallization. In the case where a metal oxide dielectric film is PZT, a crystallization temperature that allows sufficient ferroelectric characteristics to be exhibited is 600° C. In the case where the metal oxide dielectric film is BST, a crystallization temperature that allows sufficient high-dielectric characteristics to be exhibited is 650° C. A crystal formed by the foregoing method has many defects, and uneven crystal orientation. Furthermore, according to this process, it is difficult to handle a large-diameter wafer, and step-coverage is poor. Thus, the sol-gel process is not suitable for fabrication of highly integrated devices.

Next, the sputtering method is a method in which a crystal is formed on a wafer having lower electrode film, by reactive sputtering using $Ar+O_2$ plasma and a ceramic sintered-body target, and then subjected to crystallization by anealing in oxygen. According to sputtering, film uniformity could be obtained by enlarging the diameter of a target, and a sufficient deposition rate is obtained by increasing a plasma injection power. However, sputtering also has a drawback that a high temperature is required for crystallization. In the case where a metal oxide dielectric film is PZT, a crystallization temperature that allows sufficient ferroelectric characteristics to be exhibited is 600° C. In the case where the metal oxide dielectric film is BST, a crystallization temperature that allows sufficient high-dielectric characteristics to be exhibited is 650° C. Furthermore, according to sputtering, a composition is almost determined by that of a target; therefore, a target is required to be exchanged in order to vary the composition of a film, which is inconvenient in terms of production steps.

Next, according to CVD, source gases are introduced in a gas phase into a deposition chamber wherein a heated substrate is set, then a film is formed on the substrate. CVD has excellent deposition characteristics in uniformity of a large-diameter wafer and a step-coverage, so that it is considered to be promising method as a mass-production technique when applied to ULSI. Organometals are often employed for CVD source because there are few appropriate hydrides and chlorides for constituent metal element of ceramics including Ba, Sr, Bi, Pb, Ti, Zr, Ta, and La, and so on. However, organometals have rather low vapor pressure, and in most cases, present as a solid or a liquid at room temperature, so that a transportation method utilizing a carrier gas is used.

However, in the case of using the above-mentioned method, it is difficult to quantify the flow rate of an organometal gas in a carrier gas and to control the flow rate thereof exactly. More specifically, the carrier gas contains an organometal source gas with a saturation vapor pressure (determined by the temperature of a source vessel) or higher, and this flow rate depends upon not only the flow rate of a carrier gas but also the surface area of a solid material, the temperature of a thermostat, and the like. Furthermore, according to the description on film formation of PTO (lead titanate: $PbTiO_3$) using the above-mentioned film formation method, in Jpn, J. Appl. Phys. Vol. 32 (1993) p.4175), a film formation temperature of PTO is also very high (570° C.), and crystal orientation is not uniform.

Hitherto, for formation of a ferroelectric memory and a DRAM, the above-mentioned film formation method has been used. However, heating at a high temperature of about 600° C. or higher in an oxygen atmosphere is necessary, and it is also difficult to control crystal orientation.

According to a structural aspect of a semiconductor device, in order to make a ferroelectric capacitor and a high-dielectric capacitor well functioning, it is required to electrically connect either one of capacitor electrodes to diffusion layers of a selective transistor. Conventionaly, in a DRAM, polysilicon layer connected to one diffusion layer of a selective transistor is used as lower electrode of a capacitor, and a $SiO_2$ film, a $Si_3N_4$ film, or the like is formed as an insulating film of the capacitor on the surface of the polysilicon layer to construct the capacitor. However, since a ceramic thin film is made of an oxide, if the ceramic thin film is formed directly on polysilicon, the polysilicon is oxidized. Thus, a structure in which a ceramic film directry formed on a polysilicon electrode cannot be obtained. Therefore, as a one alternate structure, a cell structure in which an upper electrode of a capacitor and a diffusion layer are connected to each other by local wiring of metal made of Al or the like is described in 1995 Symposium on VLSI Technology Digest of Technical Papers, p. 123. Furthermore, according to International Electron Devices Meeting Technical Digest, 1994, p. 843, a technique for forming a PZT capacitor by using TiN barrier metal on polysilicon is described. Regarding a DRAM, for example, according to International Electron Devices Meeting Technical Digest, 1994, p. 831, a technique is described for forming a STO (strontium titanate: $SrTiO_3$) thin film on a $RuO_2/TiN$ lower electrode formed on a polysilicon plug, thereby forming a capacitor.

On the other hand, Japanese Patent Application Laid-open No. 11-317500 discloses a memory cell structure in which a capacitor is connected to a diffusion layer by alternately stacked plugs and metal pads formed simultaneously with a multi-layered metal line, unlike a conventional memory cell structure in which a capacitor is connected to a diffusion layer via local wiring and a polysilicon plug.

Incidentally, perovskite crystal has two a-axes (which may be referred to as an a-axis, b-axis) and a c-axis, as shown in FIG. 14. A polarization direction in which ferroelectricity is exhibited is a c-axis direction, and polarization does not occur in an a-axis direction. In case of a thin film, Ferroelectricity is exhibited by a component of the c-axis in a direction vertical to the film surface. Thus, the ratio of polycrystalline grains in the a-axis orientation and the c-axis orientation in the film has a large effect on ferroelectric characteristics of a ferroelectric film. As a proportion of grains oriented in the c-axis direction is increased, a magnitude of spontaneous polarization becomes larger.

Japanese Patent Application Laid-open No. 2000-58526 discloses a method for introducing an organic metal material gas and an oxide gas from separate inlet ports to a vacuum chamber, and forming a metal oxide dielectric film under a total pressure of $1 \times 10^{-2}$ Torr or less in the vacuum chamber. According to this method, even if a metal oxide dielectric thin film is formed at a low substrate temperature of 450° or lower, a film with good crystallinity having less degradation of characteristics is obtained. Therefore, after an aluminum line or a transistor is formed on an underlying layer, a ferroelectric capacitor can be formed above a substrate.

However, even with a PZT film described in JP 2000-58526 A, the ratio of grains in the a-axis orientation and the c-axis orientation of perovskite crystal may not be controlled.

SUMMARY OF THE INVENTION

Therefore, with the foregoing in mind, it is an object of the present invention to provide a metal oxide dielectric film with excellent ferroelectricity, in which orientation ratio between an a-axis and a c-axis is controlled.

The present invention relates to a metal oxide dielectric film containing perovskite crystal represented by $ABO_3$, wherein a composition ratio between an A-element and a B-element contained in the film satisfies the following Equation (1-1), and an amount of an oxide of the A-element contained in the film satisfies the following Equation (1-2):

$$1 < [A]/[B] \leq 1.1 \quad (1\text{-}1)$$

where [A]/[B] represents a composition ratio (atomic ratio) of the A-element with respect to the B-element in the metal oxide dielectric film;

$$(I_{AO}/I_{ABO3}) < 10^{-2} \quad (1\text{-}2)$$

where $I_{AO}$ and $I_{ABO3}$ respectively represent (111) peak intensity of an oxide of the A-element and (100) peak intensity of the metal oxide dielectric in an X-ray diffraction spectrum of the film.

In the case where the metal oxide dielectric film is a PZT film, the composition of Pb, Zr, and Ti contained in the film satisfies the following Equation (2-1), and the amount of PbO contained in the film satisfies the following Equation (2-2):

$$1 < [Pb]/([Zr]+[Ti]) \leq 1.1 \quad (2\text{-}1)$$

where [Pb]/([Zr]+[Ti]) represents a composition ratio (atomic ratio) of Pb with respect to the total of Zr and Ti in the PZT fim;

$$(I_{PbO}/I_{PZT}) < 10^{-2} \quad (2\text{-}2)$$

where $I_{PbO}$ and $I_{PZT}$ respectively represent (111) peak intensity of PbO and (100) peak intensity of PZT in an X-ray diffraction spectrum of the PZT film.

It is preferable that the metal oxide dielectric film is formed by thermal CVD by heating a substrate provided in a vacuum chamber, while introducing an organic metal material gas and an oxide gas from separate inlet ports into the vacuum chamber.

At this time, the total pressure in the vacuum chamber is preferably $1 \times 10^{-2}$ Torr or less. Furthermore, it is preferable that a substrate temperature during the film formation is 450° C. or lower.

It is preferable that the oxide gas includes particularly nitrogen dioxide gas.

These and other advantages of the present invention will become apparent to those skilled in the art upon reading and understanding the following detailed description with reference to the accompanying figures.

BRIEF DESCRIPTION OF THE DRAWINGS

In the accompanying drawings:

FIG. 5 shows graphs each representing a Pb excess amount and results obtained by measuring hysteresis characteristics of polarization at this time under the condition of [Zr]/[Ti]=0.5;

FIG. 6 shows graphs each representing a Pb excess amount and results obtained by measuring hysteresis characteristics of polarization under the condition of [Zr]/[Ti]= 0.75;

FIG. 7 shows graphs each representing a Pb excess amount and results obtained by measuring hysteresis characteristics of polarization under the condition of [Zr]/[Ti]= 0.9;

FIGS. 11A to 11D show production steps of an exemplary device to which the PZT film of the present invention is applied;

DESCRIPTION OF THE PREFERRED EMBODIMENTS

Figure 1:
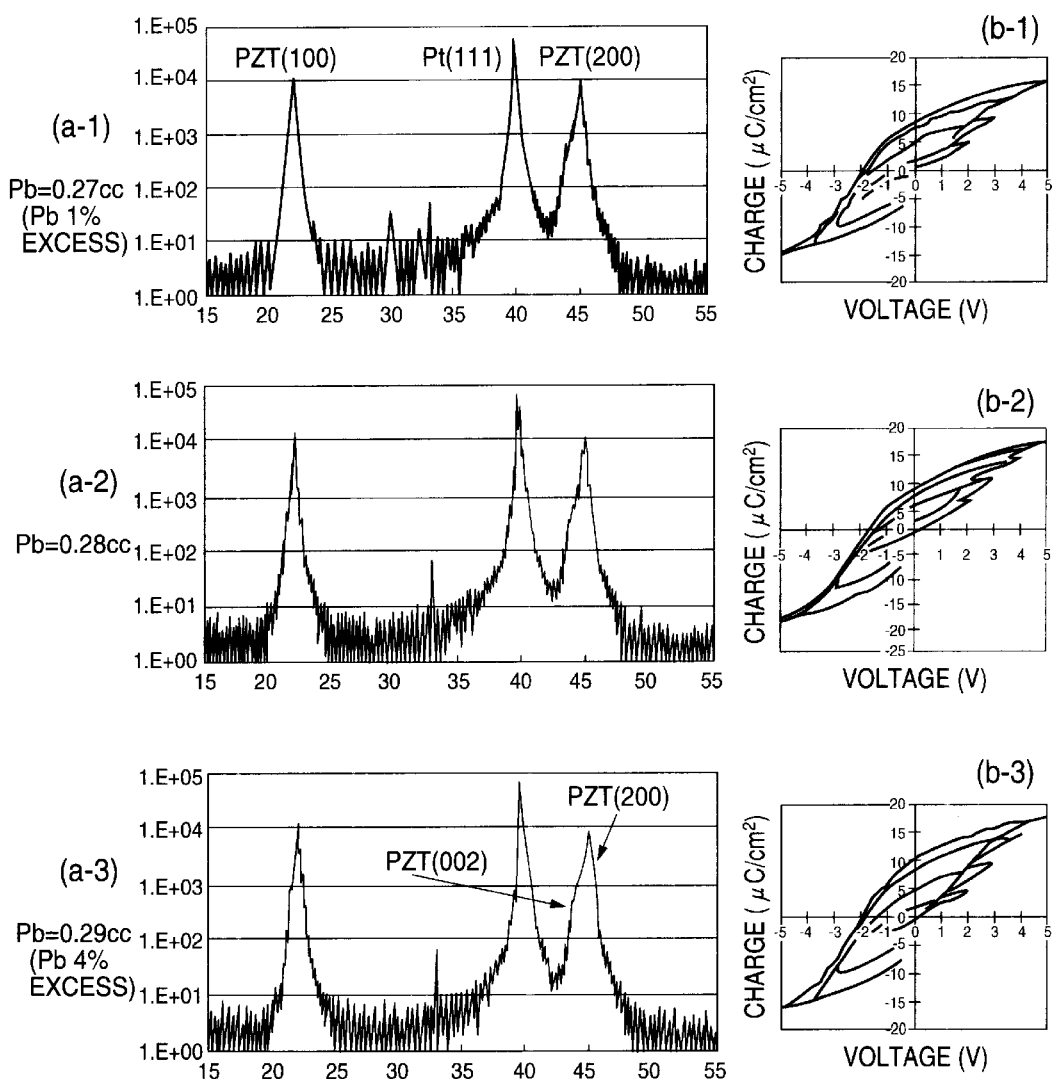
FIG. 1 is a diagram showing X-ray diffraction spectra and hysteresis characteristics (horizontal axis: voltage, vertical axis: charge per unit area) of polarization when the flow rate of a Pb source is changed.

The inventor have studied the control of a ratio between a c-axis orientation and an a-axis orientation in a metal oxide dielectric film. As a result, it is found that by setting a composition ratio ([A]/[B]) between an A-element and a B-element of perovskite crystal represented by $ABO_3$ to be larger than a stoichiometric ratio, grains in the c-axis orientation can be increased, thereby achieving the present invention.

More specifically, as described in Japanese Patent Application Laid-open No. 2000-58526, when the composition ratio between the A-element and the B-element is in a stoichiometric ratio (i.e., [A]/[B]=1), crystal of a metal oxide dielectric has strong a-axis orientation. Therefore, the magnitude of spontaneous polarization of the film is limited. According to the present invention, by setting the composition ratio ([A]/[B]) between the A-element and the B-element to be larger than 1, large spontaneous polarization is obtained. However, when the composition ratio ([A]/[B]) is set to be too large, a leakage current is increased, which degrades practicability. Therefore, generally, the composition ratio preferably satisfies the following Equation (1-1):

$$1 < [A]/[B] \leq 1.1 \tag{1-1}$$

Furthermore, when the composition ratio ([A]/[B]) between the A-element and the B-element is set to be too large, the A-element is not completely taken in perovskite crystal, and crystal of an oxide of the A-element is generated. The presence of an oxide of the A-element in the film causes not only an increase in a leakage current but also degradation of fatigue characteristics (cycle characteristics). Thus, it is preferable that an oxide of the A-element is not contained in the metal oxide dielectric film. The amount of an oxide of the A-element can be determined using, as an index, peak intensity of an oxide of the A-element appearing in an X-ray diffraction spectrum of the metal oxide dielectric film. More specifically, under the condition that the ratio between (111) peak intensity $I_{AO}$ of an oxide (AO) of the A-element and (100) peak intensity $I_{ABO3}$ of the metal oxide dielectric ($ABO_3$) in an X-ray diffraction spectrum satisfies the following Equation (1-2), the amount of the oxide (AO) of the A-element does not cause any problem.

$$(I_{AO}/I_{ABO3}) < 10^{-2} \tag{1-2}$$

where the (100) peak intensity $I_{ABO3}$ of the metal oxide dielectric ($ABO_3$) includes peaks in both the a-axis orientation and the c-axis orientation.

Furthermore, in order to allow the proportion of grains in the c-axis orientation to be clearly exhibited, the following equation:

$$1.02 \leq [A]/[B] \tag{1-3}$$

is preferably satisfied. More preferably, $$1.03 \leq [A]/[B]$$

is satisfied.

Furthermore, considering fatigue characteristics and leak characteristics, in particular, the following equation:

$$[A]/[B] \leq 1.05$$

is preferable. Thus, a range:

$$1.03 \leq [A]/[B] \leq 1.05 \tag{1-4}$$

is most preferable in terms of a total balance.

According to the present invention, examples of the metal oxide dielectric having ferroelectricity containing perovskite crystal represented by $ABO_3$, include PZT[$Pb(Zr,Ti)O_3$], PTO[$PbTiO_3$], PLT[$(Pb,La)TiO_3$], PLZT[$(Pb,La)(Zr,Ti)O_3$], PNbT[$(Pb,Nb)TiO_3$], PNbZT[$(Pb,Nb)(Zr,Ti)O_3$], and in the case where Zr is contained in these metal oxides, those in which Zr is replaced by at least one of Hf, Mn, and Ni.

Among them, those which contain Pb as an A-element are preferable. In particular, PZT, PTO, PLT, PLZT, PNbT, and PNbZT are preferable. More particularly, PZT, PTO, and PLZT are preferable, and PZT is most preferable.

The case of PZT will be described. It is required that the ratio of the composition of Pb that is an A-element in the film with respect to the total composition of Zr and Ti that are B-elements satisfies the following Equation (2-1), and the amount of PbO contained in the film satisfies the following Equation (2-2).

$$1 < [Pb]/([Zr]+[Ti]) \leq 1.1 \tag{2-1}$$

where [Pb]/([Zr]+[Ti]) represents a composition ratio of Pb with respect to the total of Zr and Ti in the PZT film.

$$(I_{PbO}/I_{PZT}) < 10^{-2} \tag{2-2}$$

where $I_{PbO}$ and $I_{PZT}$ respectively represent (111) peak intensity of PbO and (100) peak intensity of PZT in an X-ray diffraction spectrum of the PZT film. In this case, the (100) peak intensity of PZT includes peaks in both the a-axis orientation and the c-axis orientation. The preferable composition ratio in the case of the PZT film is the same as that of the above-mentioned general $ABO_3$ case.

Experimental Results of Film Formation

Next, results obtained by actually changing [Pb]/([Zr]+[Ti]) in the PZT film and investigating the physical properties of the film will be described.

A 6-inch silicon wafer was used as a substrate. On the substrate, an underlying metal layer with a Pt(100 nm)/$SiO_2$ structure was formed by sputtering at a high temperature of 300° C. Next, the substrate was set in a vacuum chamber, and a PZT film was deposited on the substrate by introducing organometal source gases and oxidizer gas into the chamber. Lead bis(dipivaloylmethanato) ($Pb(DPM)_2$), tetra (tert-butoxy) zirconium ($Zr(OtBu)_4$), tetora(isopropoxy) titanium ($Ti(OiPr)_4$), and $NO_2$ were used as a Pb material gas, a Zr material gas, a Ti material gas, and an oxidizer, respectively. The flow rate of gas was controlled by a mass-flow controller without using a carrier gas. The pressure during growth was set at $5 \times 10^{-3}$ Torr ($7 \times 10^{-1}$ Pa).

The condition of film formation were as follows: a substrate temperature was set at 430° C., and $NO_2$, $Pd(DPM)_2$, and $Ti(OiPr)_4$ were supplied at a flow rate of 3.6 SCCM, 0.18 SCCM, and 0.47 SCCM, respectively, for 30 seconds, whereby an island-shaped PTO nucleus (initial nucleus) of 3 to 5 nm was formed. Thereafter, the material gas supply condition was changed, and the flow rate of $Zr(OtBu)_4$, $Ti(OiPr)_4$, and $NO_2$ were set at 0.26 SCCM, 0.38 SCCM, and 3.6 SCCM, respectively. The flow rate of $Pb(DPM)_2$ was varied in a range of 0.27 to 0.35 SCCM in order to obtaining samples with different Pb compositions. Film formation was conducted for 1200 seconds, whereby a PZT film with a thickness of 250 nm was obtained. Under this film formation condition, [Zr]/[Ti] of a B-element is 0.65.

After forming an PZT film, upper electrodes made of Ir/IrO$_2$ was formed. Furthermore, after forming of the upper electrode, recovery annealing was conducted in an atmosphere of oxygen at 450° C. for 10 minutes.

Figure 2:
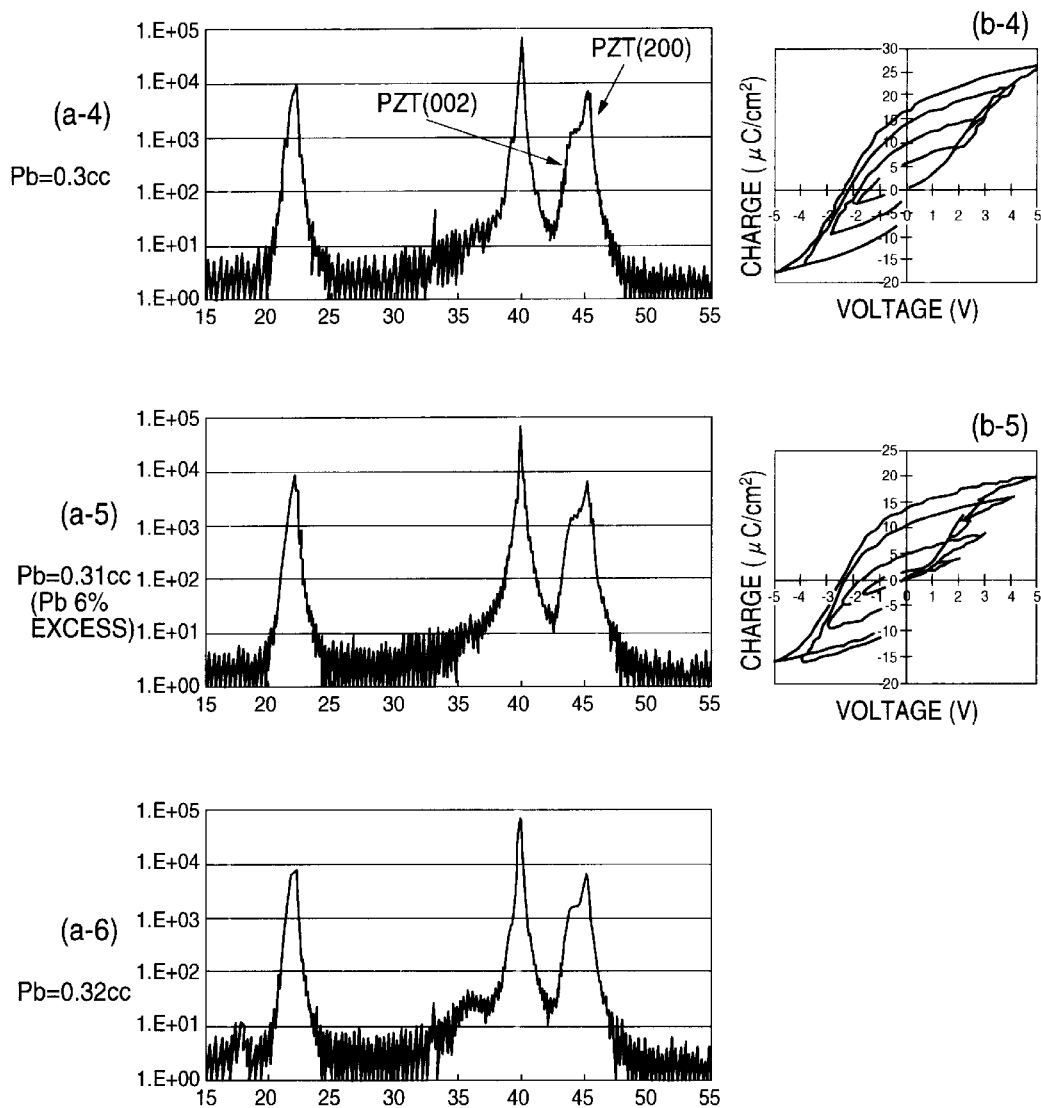
FIG. 2 is a diagram showing X-ray diffraction spectra and hysteresis characteristics of polarization when the flow rate of a Pb source gas is changed.
Figure 3:
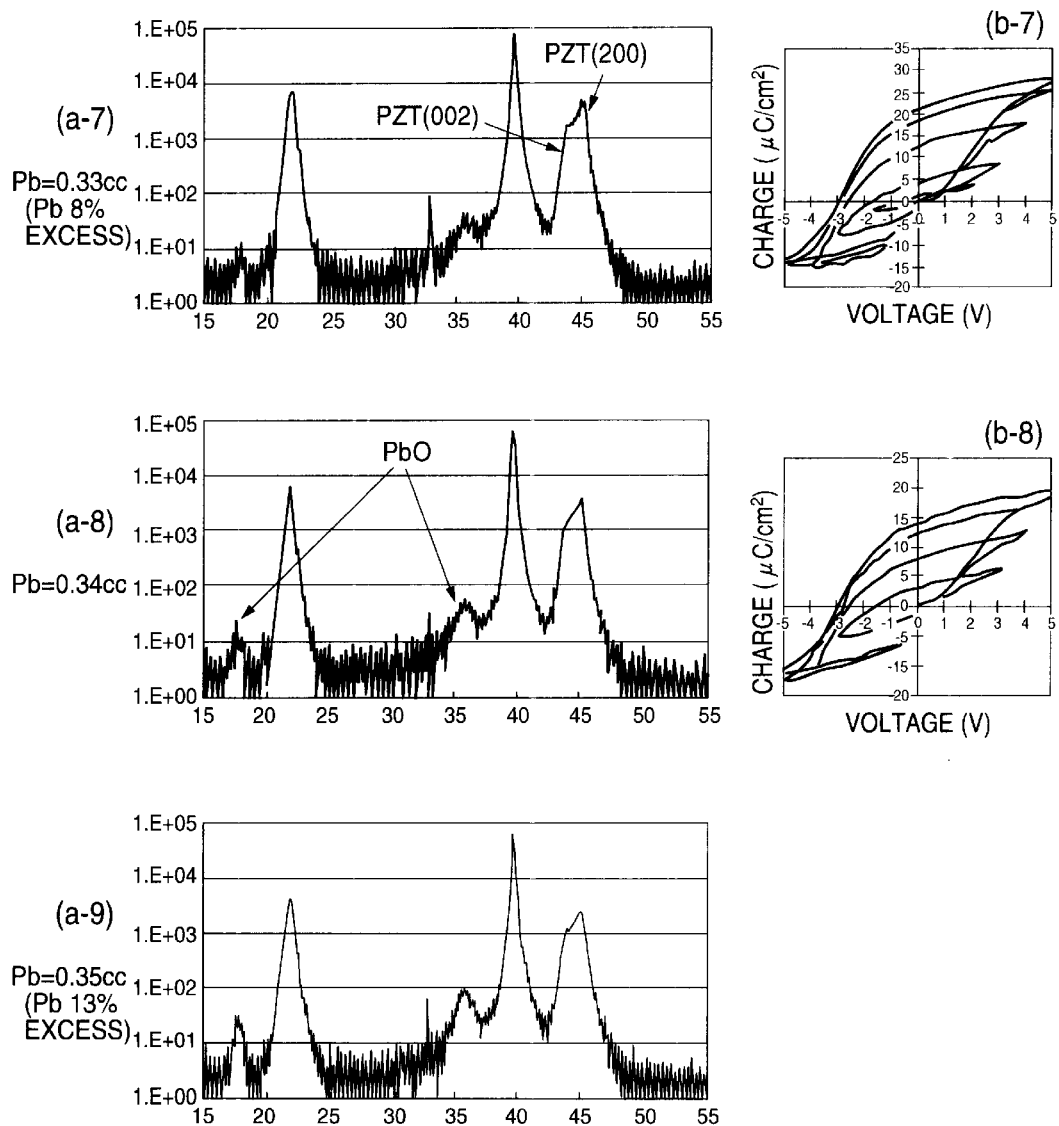
FIG. 3 is a diagram showing X-ray diffraction spectra and hysteresis characteristics of polarization when the flow rate of a Pb source gas is changed.

FIGS. 1 to 3 show X-ray diffraction spectra and hysteresis characteristics of polarization of the obtained PZT films. More specifically, (a-1) to (a-9) show the results of the X-ray diffraction spectra when the flow rate of Pb was increased, and (b-1) to (b-8) show hysteresis characteristics of corresponding polarization. In the figure, "Pb=" represents the flow rate of the Pb material (Pb(DPM)$_2$). The excess of Pb is represented by a shift from 1 of a value [Pb]/([Zr]+[Ti]) in terms of %. For example, Pb 1% excess and Pb 4% excess mean that [Pb]/([Zr]+[Ti]) are 1.01 and 1.04, respectively.

Incidentally, the composition of Pb, Zr, and Ti in the film was analyzed by fluorescent X-ray analysis, creating a calibration curve using a standard sample.

First, as shown in the X-ray diffraction spectra of (a-1) to (a-9) in FIGS. 1 to 3, all of the obtained PZT films exhibits complete (100) and (001) orientations, and grains in the other orientation were not formed. Peaks of PZT (100) in the X-ray diffraction spectra of (a-1) of FIG. 1 and the like include both a (100) plane and a (001) plane, i.e., both an a-axis and a c-axis, which are not distinguishable. On the other hand, on a high angle side of spectrum, the a-axis and the c-axis can be distinguished as peaks of (200) and (002), respectively.

In (a-1) of FIG. 1, the peak of PZT (002) appears only at a shoulder of PZT (200). However, when the flow rate of a Pb material is increased and the composition ratio of Pb in the film becomes excessive, as is apparent from (a-3) of FIG. 1, (a-5) of FIG. 2, and the like, the peak of PZT (002) gradually appears in a clear manner, and grains in the c-axis orientation are increased.

At the same time, as represented by (b-1) to (b-8), the value (2Pr: difference between inversion charge and non-inversion charge) of spontaneous polarization is increased as the grains in the c-axis orientation are increased.

Figure 4:
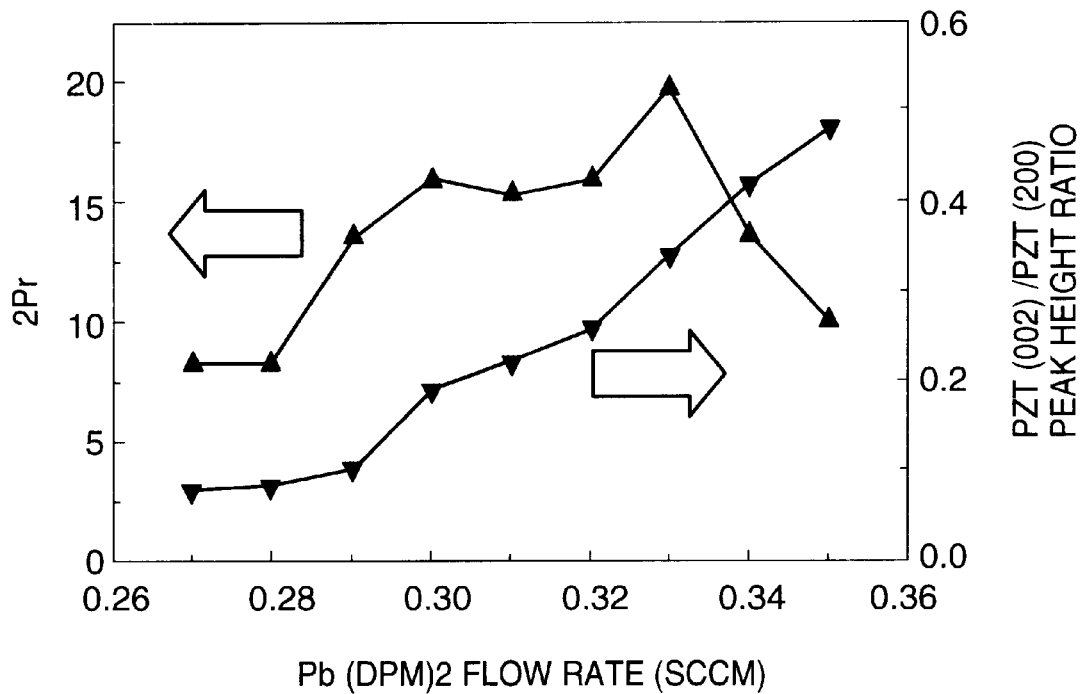
FIG. 4 is a graph showing a spontaneous polarization (2Pr) value and a ratio between a c-axis orientation and an a-axis orientation of a PZT film when the flow rate of a Pb source gas is changed.

FIG. 4 is a graph summarizing the results of FIGS. 1 to 3. In FIG. 4, the horizontal axis represents the flow rate of a Pb material, and spontaneous polarization (2Pr: left scale in the vertical axis) and an X-ray diffraction peak ratio of a c-axis/a-axis (right scale in the vertical axis) are plotted. As is apparent from FIG. 4, when the flow rate of a Pb material is increased, the proportion of grains in the c-axis orientation is increased and spontaneous polarization is also increased; however, when the flow rate is increased excessively, a leakage current is also increased, so that spontaneous polarization is decreased again.

More specifically, when an increase in the flow rate of Pb causes an excess increase in the composition of Pb, as is conspicuously represented by (a-8) of FIG. 3, a peak based on PbO crystal appears. When PbO is increased, a leakage current is also increased. If the proportion of PbO based on the X-ray spectrum is within a range satisfying the following equation:

$$(I_{PbO}/I_{PZT})<10^2 \qquad (2\text{-}2)$$

the amount of PbO can be considered to be small to an allowable degree. Herein, $I_{PbO}$ represents (111) peak intensity of PbO, and $I_{PZT}$ represents (100) peak intensity of PZT. The (100) peak of PZT includes both the a-axis and the c-axis, as described above.

The above-mentioned results are obtained in the case of film formation under the condition of [Zr]/[Ti]=0.65. Irrespective of a [Zr]/[Ti] ratio, when Equations (2-1) and (2-2) are satisfied, a PZT film with large spontaneous polarization and less leakage current can be obtained. FIGS. 5, 6, and 7 respectively show the results in the case of [Zr]/[Ti]=0.5, [Zr]/[Ti]=0.75, and [Zr]/[Ti]=0.9.

Figure 8A:
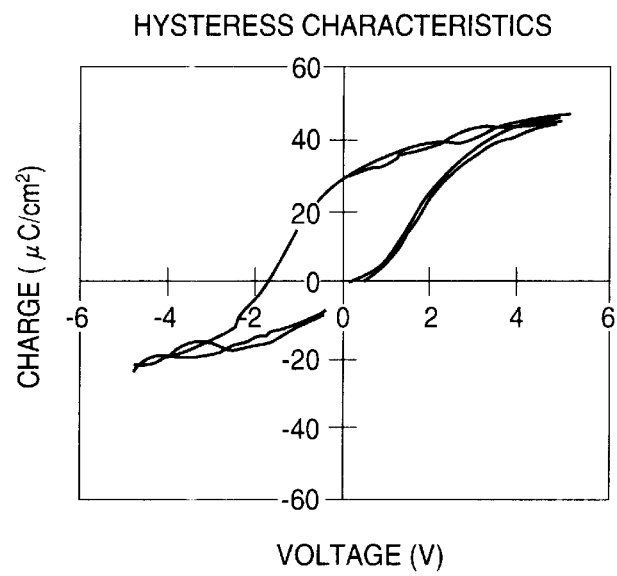
FIGS. 8A to 8C are graphs respectively representing hysteresis characteristics, fatigue characteristics, and leak characteristics of polarization when a Pb excess amount is within a range of 1.03 to 1.05.
Figure 8B:
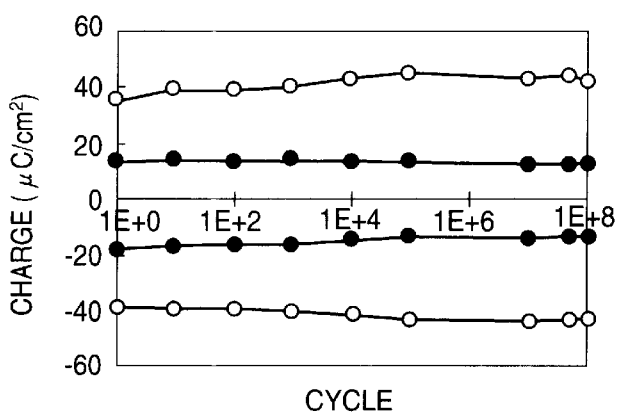
Figure 8C:
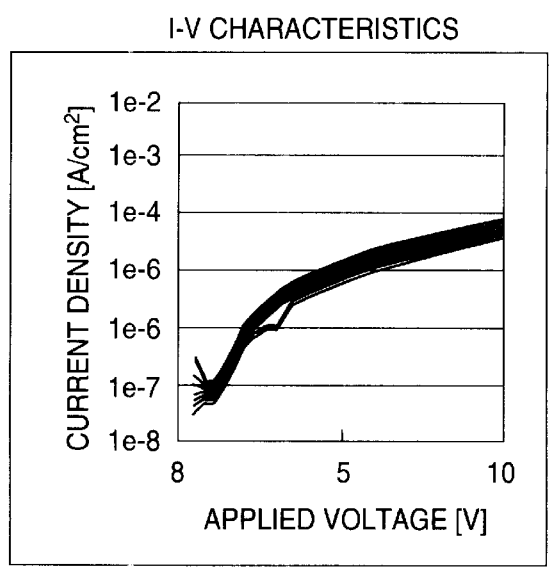

In summary of the above-mentioned results, according to the present invention, it is most preferable that [Pb]/([Zr]+[Ti]) is within a range of 1.03 to 1.05. FIGS. 8B and 8C show the results obtained by measuring fatigue characteristics and I–V characteristics of a PZT film in this case. FIG. 8A shows the results of hysteresis of polarization of a sample used in this test, and a large spontaneous polarization value (2Pr value) is obtained. FIG. 8B shows the measurement results of fatigue characteristics, in which a blank circle represents an inversion component and a black circle represents a non-inversion component, and the difference between them represents spontaneous polarization. Even after $10^8$ cycles, the value of spontaneous polarization is not changed, and fatigue characteristics are also excellent. Furthermore, FIG. 8C shows the I–V characteristics, in which a leakage current is not observed.

A film in which the composition of Pb is a stoichiometric value or more and PbO crystal is not separated conspicuously can be obtained by adjusting the flow rate of a Pb material in some range. However, the range of the flow rate of a Pb material is varied depending upon the flow rate of other material gases, a total pressure, a substrate temperature, and other conditions.

Figure 9:
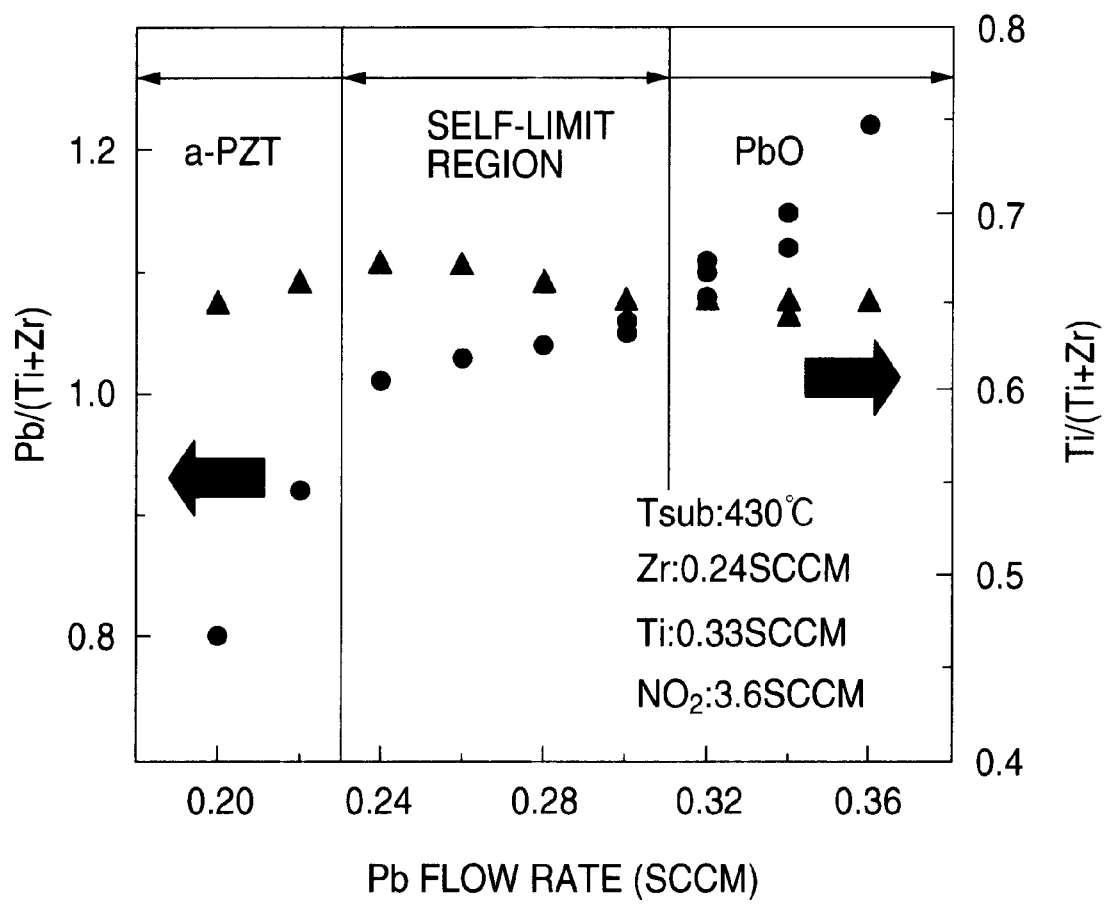
FIG. 9 is a graph showing a relationship between the flow rate of a Pb source gas and the [Pb]/([Zr]+[Ti]) composition ratio and a relationship between the flow rate of a Pb material and the [Ti]/([Zr]+[Ti]) composition ration.

FIG. 9 shows the a Pb composition ratio [Pb]/([Zr]+[Ti]) dependence on the flow rate of Pb material gas when film formation is conducted under the condition that a ratio [Ti]/([Zr]+[Ti]) in the B-element becomes about 0.67 ([Zr]/[Ti]=0.5) as represented by a right scale in the vertical axis of FIG. 9. More specifically, first, an island-shaped PTO nucleus (initial nucleus) of 3 to 5 nm was formed, and thereafter, a film was formed to a thickness of 200 nm for 1200 seconds under the condition of 0.26 SCCM of Zr(OtBu)$_4$, 0.38 SCCM of Ti(OiPr)$_4$, and 3.6 SCCM of NO$_2$. The flow rate of Pb(DPM)$_2$ at this time was varied in a range of 0.20 to 0.36 SCCM, whereby samples with different Pb compositions were produced. The other conditions were prescribed to be the same as those for forming the PZT film as shown in FIGS. 1 to 3.

When vapor phase deposition is conducted at a low pressure (about $1\times10^{-2}$ Torr (1.3 Pa) or less as in the above-mentioned film formation, from the side of a small flow rate of a Pb material, an amorphous region, a self-limit region, and a PbO deposition region appear. In the amorphous region, crystalline PZT is not obtained when a Pb composition is a stoichiometric ratio or less. In the self-limit region, a Pb composition ratio is less varied even if the flow rate of a Pb material is changed. In the PbO deposition region, PbO crystal is deposited and a Pb composition is increased rapidly. According to the study by the present inventor, it was found that a compositional change (gradient in FIG. 9) can be changed to some degree from a horizontal (identical to a stoichiometric ratio) state even in the self-limit region, depending upon the film formation condition such as a change in a flow rate of NO$_2$ gas.

Under the film formation condition adopted in this test, as is understood from FIG. 9, a self-limit region was obtained in which a Pb composition ratio was gradually increased, at a flow rate of a Pb material in a range of 0.23 SCCM to 0.31 SCCM. More specifically, by using the condition that allows a gradual gradient of a Pb composition ratio to be obtained, thereby adjusting the flow rate of a Pb material in the above-mentioned range, a Pb composition ratio can be adapted to the spirit of the present invention.

Furthermore, regarding the entire process for forming a metal oxide dielectric film of the present invention, for example, it is preferable that the film is formed by 2 step deposition method where a initial film is formed in a first condition and subsequently film formation is conducted in a second condition which is different from the first condition, as described above. More specifically, unlike a method in which a film is formed on underlying metal under the same condition as in the prior art, it is preferable that the first film formation condition for forming an initial nucleus or an initial layer with a perovskite crystal structure is rendered different from the second film formation condition for forming a film with a perovskite crystal structure on the previously formed initial nucleus, so that optimum conditions are respectively selected. By forming a film under such a condition, a thin film can be formed that has excellent orientation, crystallinity, and inversion fatigue. Herein, the initial nucleus refers to a state where a crystal nucleus is present in an island state, as described above. The initial layer refers to a state where initial nuclei gather to form a continuous layer. In any case, by forming a film under an appropriate condition, a satisfactory crystal nucleus can be contained.

Examples of the above-mentioned film formation method include the following: (a) under the first film formation condition, using all the organometal material gases to be material for a metal oxide dielectric, an initial nucleus or an initial layer with a perovskite crystal structure is formed on the conductive material, and under the second film formation condition, a film with a perovskite crystal structure is formed on the initial nucleus or the initial layer; and (b) under the first film formation condition, using only a part of the organometal material gases to be material for a metal oxide dielectric, an initial nucleus or an initial layer with a perovskite crystal structure is formed on the conductive material, and under the second film formation condition, a film with a perovskite crystal structure is grown on the initial nucleus or the initial layer. These methods are described in JP-A-2000-58525 (2000). The metal oxide dielectric film of the present invention can be formed by selecting the condition that allows a Pb composition to be excessive under the second film formation condition.

EXAMPLES

Hereinafter, the case will be described in which a PZT film of the present invention is applied to an actual device.

Device Example 1

Figure 10A:
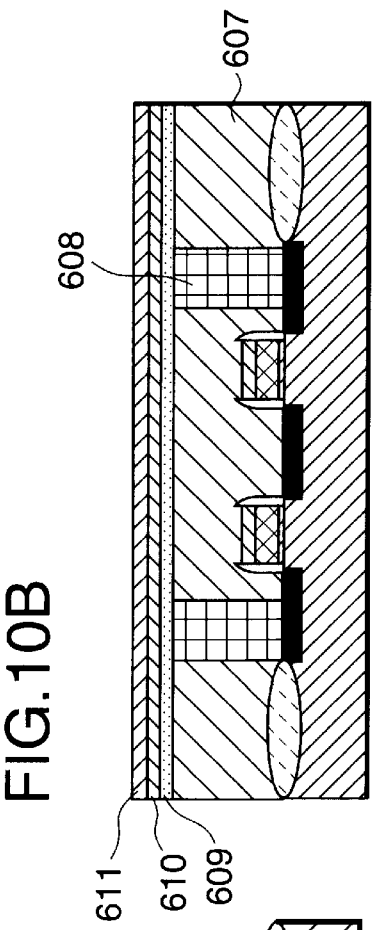
FIGS. 10A to 10D show production steps of an exemplary device to which the PZT film of the present invention is applied.

Referring to FIGS. 10A to 10D, a device example 1 will be described in which the PZT film of the present invention is applied to a memory cell. First, an oxide film was formed on a silicon substrate by wet oxidation. Thereafter, impurities such as boron and phosphorus are ion-implanted to form n-type and p-type wells. Then, a gate and a diffusion layer were formed as follows. First, a gate oxide film 601 was formed by wet oxidation, and a polysilicon film 602 to be a gate electrode was formed, followed by etching. A silicon oxide film was formed on the polysilicon film, followed by etching, whereby a side wall oxide film 603 was formed. Then, impurities such as boron and arsenic were ion-implanted to form n-type and p-type diffusion layers. Furthermore, a Ti film was formed on the resultant stack so as to react with silicon, and unreacted Ti was removed by etching, whereby Ti silicide was formed on a gate 604 and a diffusion layer 605. In the above-mentioned process, as shown in FIG. 10A, n-type and p-type MOS transistors isolated by an oxide film 606 for isolation were formed on the silicon substrate.

Figure 10B:
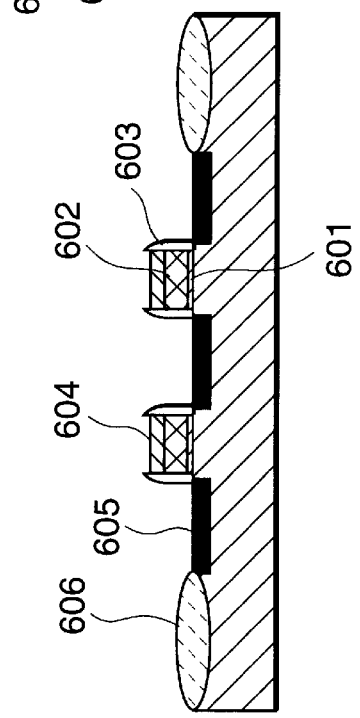

Then, contact holes and a lower electrode were formed as shown in FIG. 10B. First, a silicon oxide film or a silicon oxide film (BPSG) containing impurities such as boron was formed as a first interlayer insulation film 607. Then, the interlayer insulation film 607 was flattened by Chemical Mechanical Polishing (CMP). Contact holes were opened by etching. Impurities were implanted to the n-type and p-type diffusion layers, respectively, and heat treatment was conducted at 750° C. for 10 seconds. Thereafter, Ti and TiN films were formed as barrier metal. A tungsten film was formed thereon by CVD. Then, a plug 608 of tungsten was formed by CMP. The plug of tungsten may be formed by etch back after CVD of tungsten. Furthermore, a Ti film 609 and a TiN film 610 were continuously formed by sputtering as capacitor lower electrode layers, and a Pt film 611 of 100 nm was formed thereon.

Figure 10C:
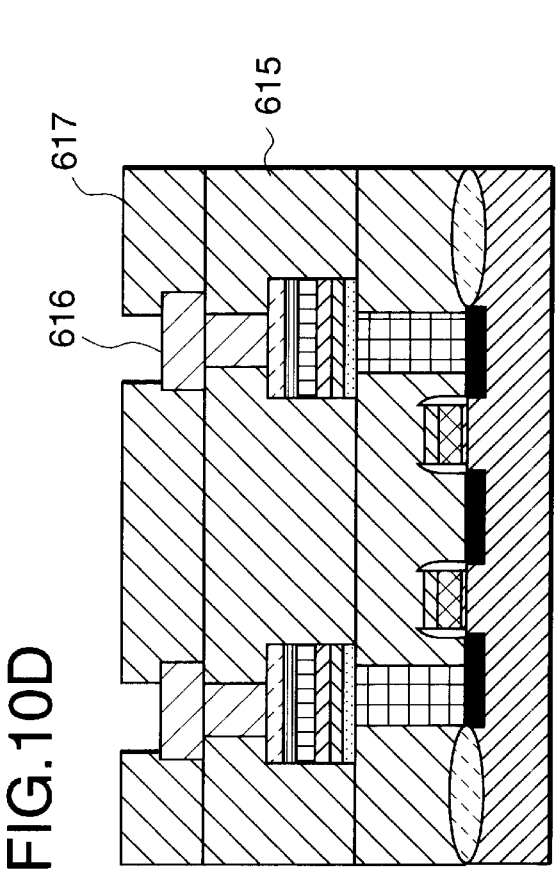

Next, a ferroelectric capacitor was formed as shown in FIG. 10C. PZT was formed to a thickness of 100 nm by using the method of the present invention. As material gases for CVD, $Pb(DPM)_2$, $Ti(OiPr)_4$, and $Zr(OtBu)_4$ were used, and as an oxidizer, $NO_2$ was used. Film formation conditions were as follows: a substrate temperature was set at 430° C., and $NO_2$ at a flow rate of 3.6 SCCM, $Pb(DPM)_2$ at a flow rate of 0.18 SCCM, $Zr(OtBu)_4$ at a flow rate of 0 SCCM, and $Ti(OiPr)_4$ at a flow rate of 0.47 SCCM were introduced for 30 seconds. Then, the film formation conditions were changed, and $NO_2$ at a flow rate of 0.36 SCCM, $Pb(DPM)_2$ at a flow rate of 0.29 SCCM, $Zr(OtBu)_4$ at a flow rate of 0.26 SCCM, and $Ti(OiPr)_4$ at a flow rate of 0.38 SCCM were supplied for 600 seconds, whereby a metal oxide dielectric film of PZT 612 was obtained.

The total pressure of gas in a vacuum chamber during growth was set at $5 \times 10^{-3}$ Torr. The thickness of a grown film was 100 nm. An $IrO_2$ film 613 and an Ir film 614 were formed by sputtering to obtain capacitor upper electrode layers. Thereafter, the capacitor upper electrode layers, the metal oxide dielectric film, and the capacitor lower electrode layers were patterned to be isolated by dry etching to form a PZT capacitor.

Figure 10D:
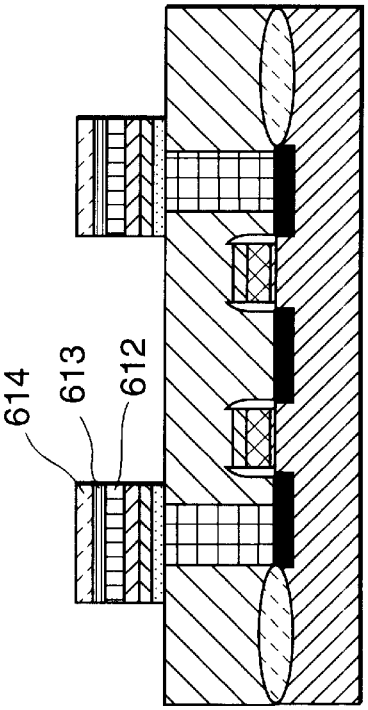

A capacitor upper electrode was formed on the resultant stack as shown in FIG. 10D. A silicon oxide film was formed as a second interlayer insulation film 615 by a plasma CVD method. Then, capacitor upper contact holes and a plate line contact holes were opened by etching. As a second metal interconnection 616, WSi, TiN, AlCu, and TiN films were formed by sputtering in this order, followed by etching. On the resultant stack, a silicon oxide film and a SiON film were formed as a passivation film 617. Thereafter, wiring pad portions were opened to evaluate electrical characteristics.

In FIGS. 10A to 10D, the capacitor lower electrode, the PZT film, and the $IrO_2/Ir$ capacitor upper electrode are formed, and thereafter, the capacitor is isolated by dry etching. As shown in FIGS. 11A to 11D, it may also be possible that the capacitor lower electrode (i.e., Pt/TiN/Ti) is isolated by dry etching, a PZT film is formed, an $IrO_2/Ir$ upper electrode is formed, and an upper electrode is isolated. According to this method, a film for dry etching becomes thin, and a finer pattern can be formed. Furthermore, the side surface of PZT is not exposed to plasma during dry etching, so that defects will not be introduced into the PZT film. Hereinafter, electrical characteristics of the capacitors created by the methods in FIGS. 10A to 10D and 11A to 11D are shown.

Five thousand PZT capacitors (1 μm square) were connected in parallel, and characteristics thereof were measured. As a result, a value of 20 $\mu C/cm^2$ or more was obtained as the difference between inversion charge and non-inversion charge, exhibiting satisfactory dielectric characteristics. Furthermore, fatigue characteristics were also satisfactory. There was less leakage current, and retention characteristics were also excellent. Furthermore, a transistor with a gate length of 0.26 μm was evaluated for characteristics. As a result, variation in a threshold value Vt was 10% or less on the entire wafer surface in both p-type and n-type regions, showing that the characteristics of the transistor were satisfactory. Furthermore, the resistance of a capacitor lower contact hole (0.4 μm square) was measured by contact chain, which was found to be satisfactory (i.e., 10 Ωcm or less per contact hole).

Device Example 2

Figure 12B:
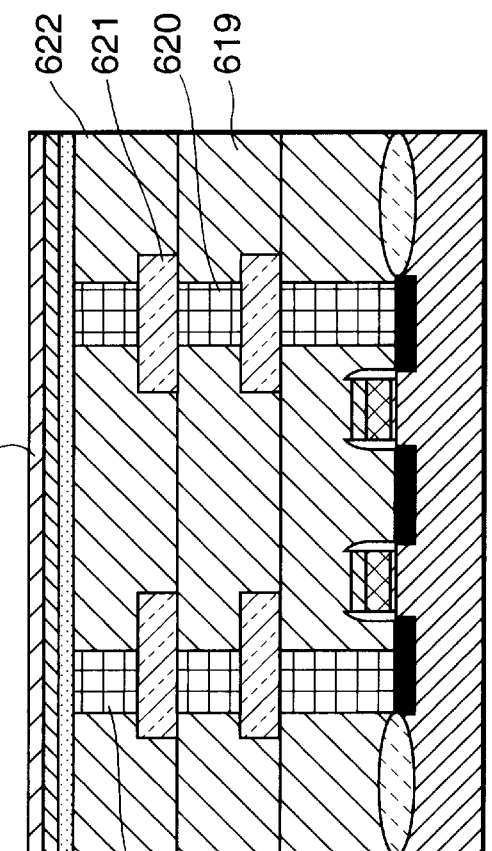
FIGS. 12A and 12B show production steps of an exemplary device to which the PZT film of the present invention is applied.
Figure 12A:
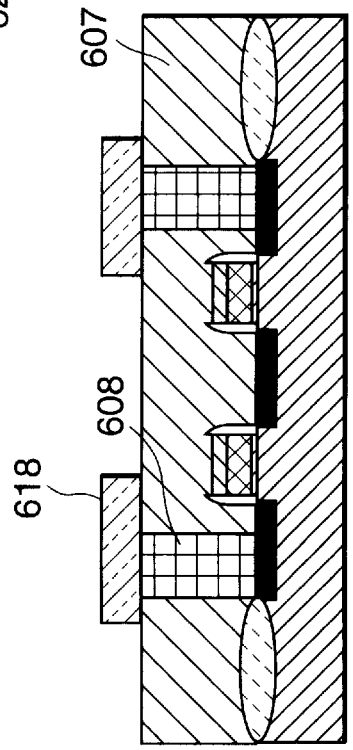

Next, FIG. 12 shows a device example 2 in which the PZT film of the present invention is applied to a memory cell. Up to the step of producing the plug of tungsten, the same process as that of the device example 1 of the memory cell was conducted, and Ti and TiN films were formed on the resultant stack. An AlCu film was formed by sputtering to obtain first aluminum interconnection 618 by dry etching. During the above-mentioned process, as shown in FIG. 12A, the first aluminum interconnections were formed on n-type and p-type MOS transistors.

Vias and second aluminum interconnections were formed as shown in FIG. 12B. First, a silicon oxide film or a silicon oxide film (BPSG) containing impurities such as boron was formed as a second interlayer insulation film 619, and thereafter, the second interlayer insulation film 619 was flattened by CMP. Then, via holes were opened by etching, and Ti and TiN films were formed as barrier metal. A tungsten film was formed thereon by CVD. Thereafter, a plug 620 of tungsten was formed by CMP. The plug of tungsten may be formed by etch back after CVD of tungsten. Ti and TiN films were formed thereon by sputtering to obtain second aluminum interconnection 621 by dry etching. A silicon oxide film or a silicon oxide film (BPSG) containing impurities such as boron was formed as a third interlayer insulation film 622, and thereafter, the third interlayer insulation film 622 was flattened by CMP. Next, via holes were opened by etching, and then, Ti and TiN films were formed as barrier metal. A tungsten film was formed thereon by CVD, and then, a plug 623 of tungsten was formed by CMP. The plug of tungsten may be formed by etch back after CVD of tungsten. By repeating formation of aluminum interconnection lines, interlayer insulation films, and vias, a desired number of line layers can be formed. On the last tungsten plug, a Ti film 624 and a TiN film 625 were continuously formed by sputtering, and a Pt film 626 of 100 nm was formed to obtain a capacitor lower electrode.

Figure 13A:
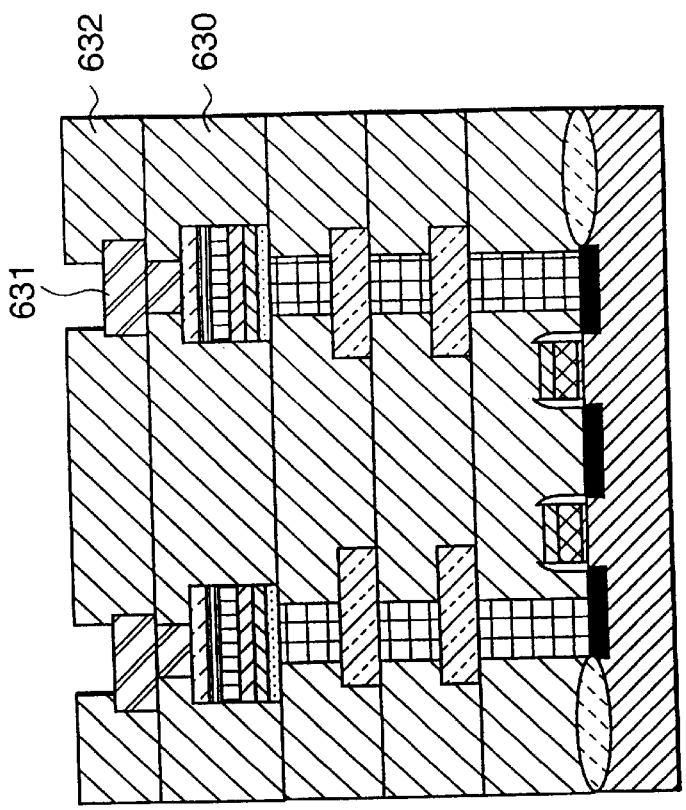
FIGS. 13A and 13B show production steps of an exemplary device to which the PZT film of the present invention is applied.

Next, as shown in FIG. 13A, as a ferroelectric capacitor, PZT was formed to a thickness of 100 nm. As material, Pb(DPM)$_2$, Ti(OiPr)$_4$, and Zr(OtBu)$_4$ were used, and as an oxidizer, NO$_2$ was used.

Film formation conditions were as follows: a substrate temperature was set at 430° C., and NO$_2$ at a flow rate of 3.6 SCCM, Pb(DPM)$_2$ at a flow rate of 0.18 SCCM, Zr(OtBu)$_4$ at a flow rate of 0 SCCM, and Ti(OiPr)$_4$ at a flow rate of 0.47 SCCM were introduced into a vacuum chamber for 30 seconds. Then, the film formation conditions were changed, and NO$_2$ at a flow rate of 0.36 SCCM, Pb(DPM)$_2$ at a flow rate of 0.29 SCCM, Zr(OtBu)$_4$ at a flow rate of 0.26 SCCM, and Ti(OiPr)$_4$ at a flow rate of 0.38 SCCM were supplied for 600 seconds, whereby a metal oxide dielectric film of PZT 627 was obtained.

The total pressure of gas in a vacuum chamber during growth was set at $5\times10^{-3}$ Torr. The thickness of a grown film was 100 nm. An IrO$_2$ film 628 and an Ir film 629 were formed by sputtering to obtain capacitor upper electrode layers. Thereafter, the capacitor upper electrode layers, the metal oxide dielectric film, and the capacitor lower electrode layers were patterned to be isolated by dry etching to form a PZT capacitor.

Figure 13B:
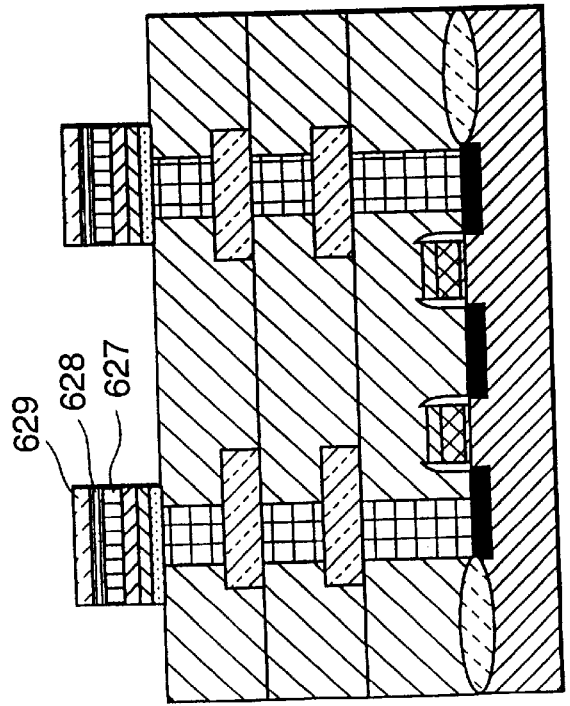
Figure 14:
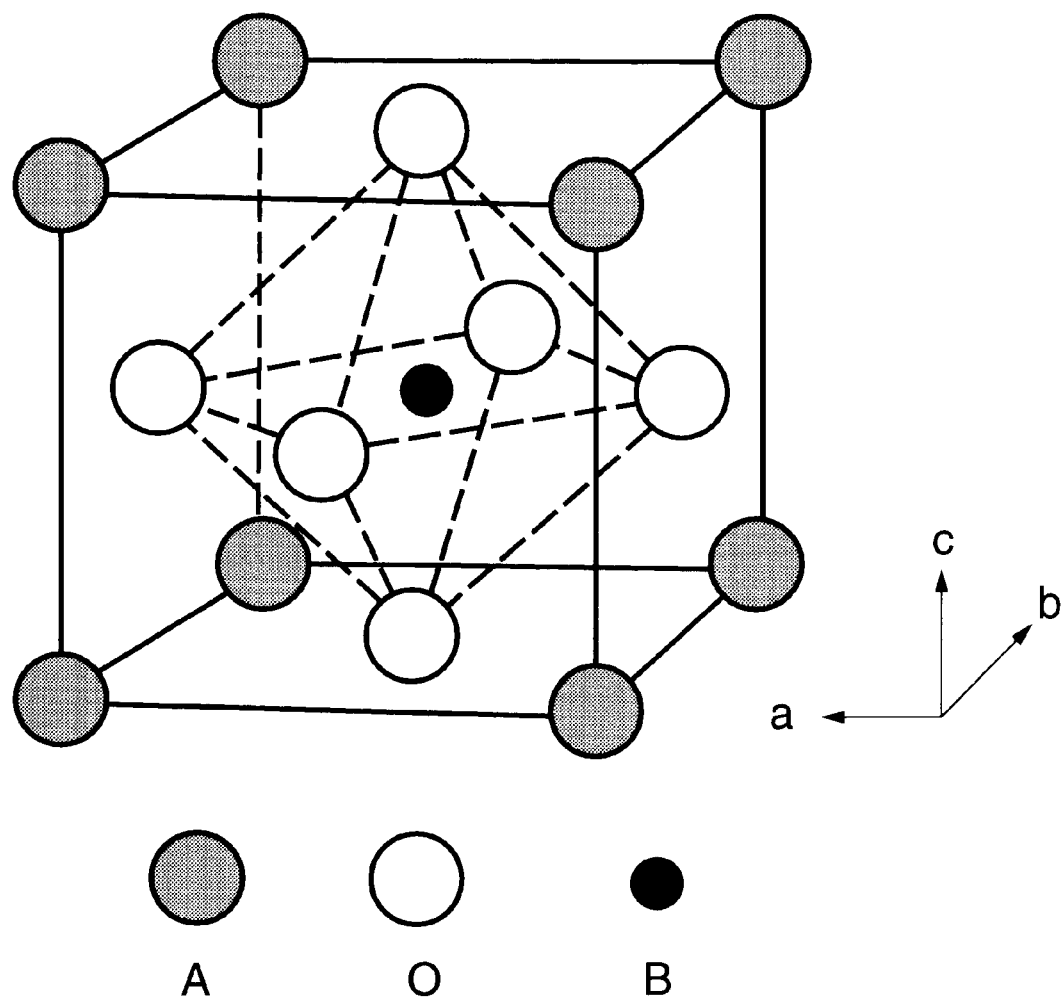
FIG. 14 is a diagram showing a perovskite crystal structure.

A capacitor upper electrode was formed on the resultant stack as shown in FIG. 13B. A silicon oxide film was formed as a fourth interlayer insulation film 630 by a plasma CVD method. Then, capacitor upper contact holes and plate line contact holes were opened by etching. As a third metal line 631, WSi, TiN, AlCu, and TiN films were formed by sputtering in this order, followed by etching. On the resultant stack, a silicon oxide film and a SiON film were formed as a passivation film 632. Thereafter, wiring pad portions were opened to evaluate electrical characteristics.

Even in the case where there is an aluminum line in a lower portion, in the same way as in the case in FIGS. 11A to 11D, it may also be possible that a PZT film is formed after a capacitor lower electrode (i.e., Pt/TiN/Ti) is isolated by dry etching, and an IrO$_2$/Ir capacitor upper electrode is formed to isolate a capacitor upper electrode. When this method is used, a film for dry etching becomes thin, and a finer pattern can be formed. Furthermore, the side surface of PZT is not exposed to plasma, so that defects will not be introduced into the PZT film.

The memory cell produced in the device example 2 was evaluated for electrical characteristics in the same way as in the memory cell produced in the device example 1.

As a result, a value of 20 μC/cm$^2$ or more was obtained as the difference between inversion charge and non-inversion charge, exhibiting satisfactory dielectric characteristics. Furthermore, fatigue characteristics were also satisfactory. There was less leakage current, and retention characteristics were also excellent. Furthermore, a transistor with a gate length of 0.26 μm was evaluated for characteristics. As a result, variation in a threshold value Vt was 10% or less on the entire wafer surface in both p-type and n-type regions, showing that the characteristics of the transistor were satisfactory. Furthermore, the resistance of a capacitor lower contact hole (0.4 μm square) was measured by contact chain, which was found to be satisfactory (i.e., 10 Ωcm or less per contact hole).

In both the device examples 1 and 2, contact holes using tungsten have been described. However, even in the contact holes using polysilicon, ferroelectric capacitor characteristics, transistor characteristics, and contact resistance were satisfactory in the same way.

According to the present invention, a metal oxide dielectric film can be provided, in which the ratio between an a-axis orientation and a c-axis orientation is controlled, and which has a large spontaneous polarization value and outstanding ferroelectric characteristics with less leakage current.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A metal oxide dielectric film on a substrate, comprising perovskite crystal represented by the formula $ABO_3$, wherein A represents at least one A-element and B represents at least one B-element, wherein a composition ratio between the A-element and the B-element contained in the film satisfies the following Equation (1-1), and an amount of an oxide of the A-element contained in the film satisfies the following Equation (1-2):

$$1.03 \leq [A]/[B] \leq 1.1 \tag{1-1}$$

where $[A]/[B]$ represents a composition ratio (atomic ratio) of the A-element with respect to the B-element in the metal oxide dielectric film;

$$(I_{AO}/I_{ABO3}) < 10^{-2} \tag{1-2}$$

where $I_{AO}$ and $I_{ABO3}$ respectively represent (111) peak intensity of an oxide of the A-element and (100) peak intensity of the metal oxide dielectric in an X-ray diffraction spectrum of the film.

2. The metal oxide dielectric film according to claim 1, wherein the metal oxide dielectric film is a PZT film, and a composition of Pb, Zr, and Ti contained in the film satisfies the following Equation (2-1), and an amount of PbO contained in the film satisfies the following Equation (2-2):

$$1.03 < [Pb]/([Zr]+[Ti]) \leq 1.1 \tag{2-1}$$

where $[Pb]/([Zr]+[Ti])$ represents a composition ratio (atomic ratio) of Pb with respect to the total of Zr and Ti in the PZT film;

$$(I_{PbO}/I_{PZT}) < 10^{-2} \tag{2-2}$$

where $I_{PbO}$ and $I_{PZT}$ respectively represent (111) peak intensity of PbO and (100) peak intensity of PZT in an X-ray diffraction spectrum of the PZT film.

3. The metal oxide dielectric film according to claim 1, wherein said metal oxide dielectric film is formed by thermal CVD by heating the substrate in a vacuum chamber, while introducing organometal material gases and an oxidizer gas from separate inlet ports into the vacuum chamber.

4. The metal oxide dielectric film according to claim 3, wherein a total pressure during the film formation is $1 \times 10^{-2}$ Torr or lower.

5. The metal oxide dielectric film according to claim 3, wherein the substrate temperature during the film formation is 450° C. or lower.

6. The metal oxide dielectric film according to claim 3, wherein the oxidizer gas includes nitrogen dioxide.

7. The metal oxide dielectric film according to claim 1, wherein a composition ratio between the A-element and the B-element satisfies the following equation:

$$1.03 < [A]/[B] \leq 1.05 \tag{1-4}$$

8. The metal oxide dielectric film according to claim 2, wherein a composition ratio of Pb with respect to the total of Zr and Ti satisfies the following equation:

$$1.03 < [Pb]/([Zr]/[Ti]) \leq 1.05 \tag{2-3}$$

9. A PZT film on a substrate, wherein a composition of Pb, Zr, and Ti contained in the film satisfies the following Equation (2-3):

$$1.03 \leq [Pb]/([Zr]+[Ti]) \leq 1.05 \tag{2-3}$$

where $[Pb]/([Zr]/[Ti])$ represents a composition ratio (atomic ratio) of Pb with respect to the total of Zr and Ti in the PZT film.

10. The metal oxide dielectric film according to claim 1, wherein an underlying metal layer is between the substrate and the metal oxide dielectric film.

11. The metal oxide dielectric film according to claim 1, wherein the metal oxide dielectric film is a $PbTiO_3$ film.

12. The metal oxide dielectric film according to claim 1, wherein the metal oxide dielectric film is a $(Pb,La)TiO_3$ film.

13. The metal oxide dielectric film according to claim 1, wherein the metal oxide dielectric film is a $(Pb,La)(Zr,Ti)O_3$ film.

14. The metal oxide dielectric film according to claim 1, wherein the metal oxide dielectric film is a $(Pb,Nb)TiO_3$ film.

15. The metal oxide dielectric film according to claim 1, wherein the metal oxide dielectric film is a $(Pb,Nb)(Zr,Ti)O_3$ film.

16. The metal oxide dielectric film according to claim 1, wherein the metal oxide dielectric film is a $(Pb,Nb)(Z,Ti)O_3$ film, wherein Z is selected from the group consisting of Hf, Mn, and Ni.

17. The metal oxide dielectric film according to claim 1, wherein the metal oxide dielectric film is a $(Pb,La)(Z,Ti)O_3$ film, wherein Z is selected from the group consisting of Hf, Mn, and Ni.

18. The metal oxide dielectric film according to claim 1, wherein the metal oxide dielectric film is a $Pb(Z,Ti)O_3$ film, wherein Z is selected from the group consisting of Hf, Mn, and Ni.

* * * * *

UNITED STATES PATENT AND TRADEMARK OFFICE
CERTIFICATE OF CORRECTION

PATENT NO. : 6,573,211 B2
DATED : June 3, 2003
INVENTOR(S) : Toru Tatsumi

It is certified that error appears in the above-identified patent and that said Letters Patent is hereby corrected as shown below:

Column 13,
Line 28, change "1.03<[Pb]/([Zr]+[Ti])≦1.1" to -- 1.03≤[Pb]/([Zr]+[Ti])≤1.1 --.

Column 14,
Line 5, change "1.03<[A]/[B]≦1.05" to -- 1.03≤[A]/[B]≤1.05 --.
Line 10, change "1.03<[Pb]/([Zr]+[Ti])≦1.05" to -- 1.03≤[Pb]/([Zr]+[Ti])≤1.05 --.
Line 18, change "[Pb]/([Zr]/[Ti])" to -- [Pb]/([Zr]+[Ti]) --.

Signed and Sealed this

Ninth Day of December, 2003

JAMES E. ROGAN
*Director of the United States Patent and Trademark Office*